# United States Patent
Lee et al.

(10) Patent No.: US 8,962,466 B2
(45) Date of Patent: Feb. 24, 2015

(54) LOW TEMPERATURE TRANSITION METAL OXIDE FOR MEMORY DEVICE

(71) Applicant: Macronix International Co., Ltd., Hsinchu (TW)

(72) Inventors: Feng-Min Lee, Hsinchu (TW); Erh-Kun Lai, Elmsford, NY (US); Wei-Chih Chien, Taipei (TW); Ming-Hsiu Lee, Hsinchu (TW); Chih-Chieh Yu, Miaoli (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/895,059

(22) Filed: May 15, 2013

(65) Prior Publication Data

US 2014/0264232 A1    Sep. 18, 2014

Related U.S. Application Data

(60) Provisional application No. 61/778,518, filed on Mar. 13, 2013.

(51) Int. Cl.
*H01L 29/02* (2006.01)
*H01L 21/3205* (2006.01)
(Continued)

(52) U.S. Cl.
CPC ...... *H01L 21/02551* (2013.01); *H01L 45/1253* (2013.01); *H01L 45/141* (2013.01)
USPC ........... 438/591; 438/658; 438/261; 438/382; 438/758; 438/452; 257/4; 257/656; 257/E45.001; 257/E21.66; 257/E21.006; 365/148

(58) Field of Classification Search
CPC ... H01L 45/06; H01L 45/085; H01L 45/1233; H01L 45/126; H01L 45/1266; H01L 45/146; H01L 45/147; H01L 29/408; H01L 29/4234; H01L 29/42344; H01L 29/42348; H01L 29/42352; H01L 29/4238; H01L 29/11551; H01L 29/7881; H01L 29/792; H01L 29/66825; H01L 29/66833; H01L 27/0207; H01L 27/0688; H01L 27/105; H01L 27/11551; H01L 27/11556; H01L 27/11563; H01L 27/11578; H01L 27/11524; H01L 27/11582
USPC ......... 438/658, 758, 384, 613, 653, 656, 687, 438/478, 382, 623, 542, 591, 261, 142, 99; 257/2, 4, 5.6, 656, E29.336, E45.001, 257/E21.002, E21.581, E23.144, E21.352, 257/E21.66, E21.679, E21.006, E27.07, 257/E51.002; 365/63, 148, 185.17, 230.06, 365/96, 174, 130

See application file for complete search history.

(56) References Cited

U.S. PATENT DOCUMENTS 6,849,905 B2    2/2005    Ilkbahar et al.
8,134,139 B2    3/2012    Lin et al.
(Continued)

OTHER PUBLICATIONS

U.S. Appl. No. 13/675,923, filed Nov. 13, 2012, 22 pages.

*Primary Examiner* — Chuong A Luu
*Assistant Examiner* — Moazzam Hossain
(74) *Attorney, Agent, or Firm* — Haynes Beffel & Wolfeld LLP

(57) ABSTRACT

A metal oxide formed by in situ oxidation assisted by radiation induced photo-acid is described. The method includes depositing a photosensitive material over a metal surface of an electrode. Upon exposure to radiation (for example ultraviolet light), a component, such as a photo-acid generator, of the photosensitive material forms an oxidizing reactant, such as a photo acid, which causes oxidation of the metal at the metal surface. As a result of the oxidation, a layer of metal oxide is formed. The photosensitive material can then be removed, and subsequent elements of the component can be formed in contact with the metal oxide layer. The metal oxide can be a transition metal oxide by oxidation of a transition metal. The metal oxide layer can be applied as a memory element in a programmable resistance memory cell. The metal oxide can be an element of a programmable metallization cell.

19 Claims, 13 Drawing Sheets

(51) Int. Cl.
*H01L 47/00* (2006.01)
*H01L 21/02* (2006.01)
*H01L 45/00* (2006.01)

(56) References Cited

U.S. PATENT DOCUMENTS

| | | |
|---|---|---|
| 8,279,656 B2 | 10/2012 | Chien et al. |
| 2002/0142609 A1* | 10/2002 | Hart et al. .................... 438/710 |
| 2003/0031958 A1* | 2/2003 | Tohge et al. .................... 430/325 |
| 2007/0105372 A1* | 5/2007 | Geusic et al. .................. 438/653 |
| 2009/0184396 A1* | 7/2009 | Kim et al. ...................... 257/536 |
| 2010/0059808 A1 | 3/2010 | Zheng et al. |
| 2011/0180775 A1 | 7/2011 | Lin et al. |
| 2012/0097915 A1* | 4/2012 | Mikawa et al. .................... 257/4 |
| 2012/0181599 A1 | 7/2012 | Lung |
| 2012/0188813 A1 | 7/2012 | Chien et al. |
| 2012/0280199 A1* | 11/2012 | Takagi ............................... 257/3 |
| 2013/0178042 A1* | 7/2013 | Ninomiya et al. ............. 438/382 |
| 2013/0182487 A1 | 7/2013 | Lee et al. |

* cited by examiner

LOW TEMPERATURE TRANSITION METAL OXIDE FOR MEMORY DEVICE

RELATED APPLICATIONS

This application claims the benefit of U.S. Provisional Patent Application No. 61/778,518 filed on 13 Mar. 2013, which application is incorporated by reference as if fully set forth herein.

BACKGROUND

The present invention relates to memory devices. In particular, a method for fabricating a memory device and a memory device structure using programmable resistance materials are described.

A variety of memory technologies used in integrated circuits employ metal oxides. Memory types that employ metal oxides include programmable metallization cells and resistive RAM, for example. Metal oxide based memory devices, including those using transition metal oxides, are expected to improve scalability of memory structures and their compatibility with conventional CMOS processing.

Techniques used to form metal oxides include deposition methods such as chemical vapor deposition (CVD), physical vapor deposition (PVD) or sputtering, atomic layer deposition (ALD), and others. These techniques invariably need precursors and specialized deposition equipment, which are usually costly and have high operation costs. Direct oxidation of an underlying metal has been used (for example, a rapid thermal oxidation using an oxidizing agent such as oxygen or nitrous oxide), which can require high temperatures, greater than 450 degrees Celsuis, and consume a large part of a "thermal budget" in manufacturing an integrated circuit.

It is desirable to provide metal oxide structures having improved quality, and which have a lower impact on the thermal budget in manufacturing.

SUMMARY

A summary of the technologies described herein is provided for introduction to the detailed description which follows.

A method of forming a component of an integrated circuit including metal oxide is described. The component can have an active element comprising a metal, such as a transition metal, and have a metal surface. To form a metal oxide, a photosensitive material, a component of which can be a photo-acid generator, is deposited on the metal surface. Upon exposure of the photosensitive material to radiation (for example ultraviolet light) an oxidizing reactant, such as a photo-acid, is formed which causes oxidation of the metal at the metal surface. As a result of the oxidation, a layer of metal oxide is formed. The photosensitive material can then be removed, and additional elements of the component can be formed in contact with the metal oxide layer.

The metal oxide can be a transition metal oxide formed by oxidation of a transition metal. The metal oxide layer can be applied as a memory element in a programmable resistance memory cell. Depending on the implementation, the metal oxide can be an element, such as a solid state electrolyte layer, of a programmable metallization cell.

In another aspect, a method of forming a component of an integrated circuit includes forming a plurality of first active elements on a substrate. Each active element includes metal having a metal surface. A photosensitive material is deposited over the metal surfaces of the plurality of first active elements and a photomask is provided over the photosensitive material to expose the photosensitive material over one or more selected first active elements while masking the photosensitive material over unselected first active elements. Upon exposure to radiation, a metal oxide layer forms on the selected active elements. The photosensitive material can then be removed, and an element of the component, for example, a second active element, is formed over the metal oxide layer. The unselected first active elements remain intact and can function as, for example, interlayer conductors in various embodiments.

In yet another aspect, a memory device structure is provided. The memory device structure includes a first electrode, which comprises a metal, and a metal oxide that comprises an oxide of the metal at the surface of the first electrode. The first electrode can comprise a conductive core having a metal surface and a liner around the core. A dielectric layer on the first electrode, which comprises a metal oxide of metal at the metal surface of the core and an oxide of the liner. A second electrode can be formed in contact with the metal oxide to form a resistive memory device.

In yet another aspect, a memory device structure is provided that comprises a programmable metallization cell. A bottom contact can comprise a transition metal with a liner that also includes a metal. A dielectric layer overlies the bottom contact and includes an oxide of the transition metal on the transition metal, and an oxide of the liner on the liner. The dielectric layer can have substantially uniform thickness, such as can be made using the manufacturing process described herein. An ion supply layer can be formed in contact with the dielectric layer. A second electrode overlies the ion supply layer, to provide a programmable metallization cell.

Other aspects and advantages of the present technology can be seen on review of the detailed description and the claims which follow.

DRAWINGS

DETAILED DESCRIPTION

Figure 1:
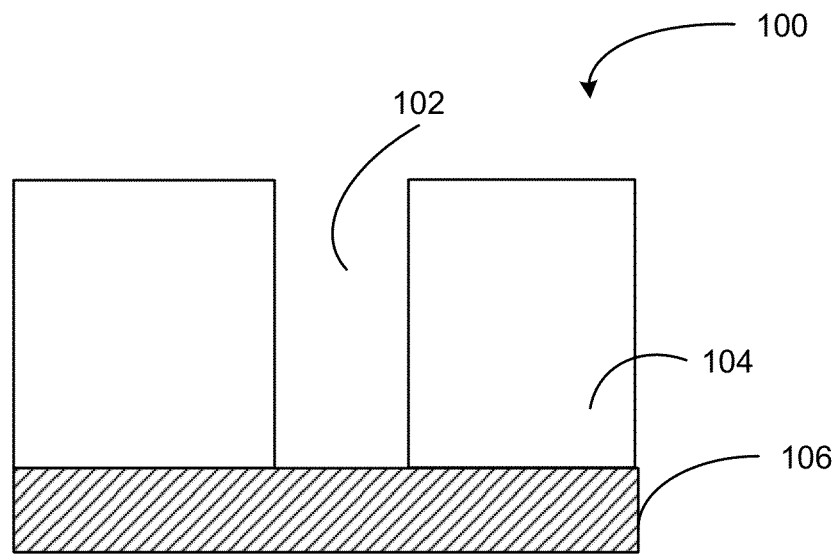
FIGS. 1-6 illustrate a method of forming an oxide memory material.

FIGS. 1-6 illustrate a method of forming a memory device, including a metal oxide memory material. A partial memory device 100 is shown in FIG. 1. As shown, the partial memory device 100 includes an opening 102 configured in an interlayer insulator material 104. Interlayer insulator material 104 can be silicon oxide, silicon nitride, silicon oxynitride, a high K dielectric material, a low K dielectric material, or a combination of materials. Opening 102 extends to a conductive region 106 of partial memory device 100. Conductive region 106 can be an impurity region (source region or drain region) in a semiconductor substrate in certain embodiments. Conductive region 106 can be, for example, a metal or polysilicon, or other interconnect materials.

Figure 2:
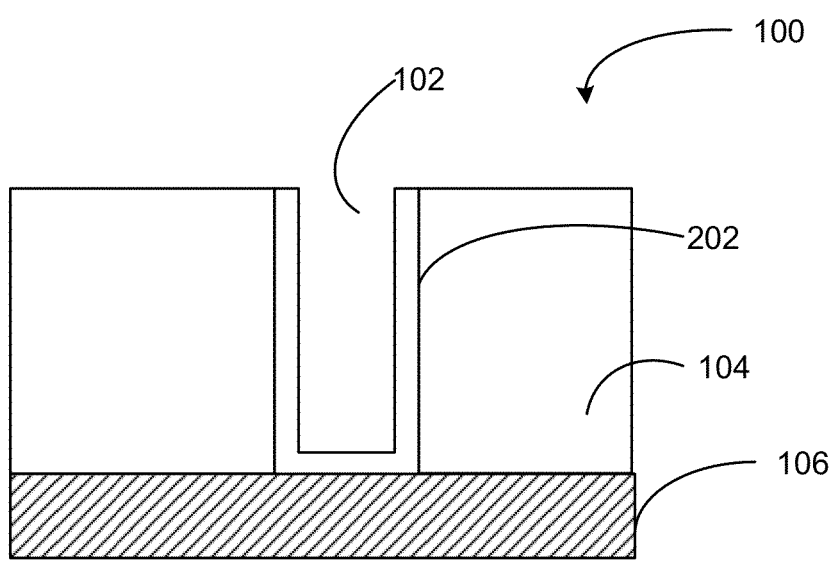

Depending on the embodiment, a layer 202 can be formed to conformably line opening 102, as illustrated in FIG. 2, to act as a diffusion barrier, an adhesion layer, or both (as examples). Layer 202 can be a conductive metal nitride such as titanium nitride, tantalum nitride, tungsten nitride, and others. Layer 202 can also be a metal material, for example, titanium in certain implementations. Alternatively, layer 202 can include a combination of materials, for example, a conductive metal nitride over a metal material. For example, the layer 202 used as a diffusion barrier or adhesion layer for deposition of a transition metal like tungsten in a via, can comprise titanium nitride over titanium.

Figure 3:
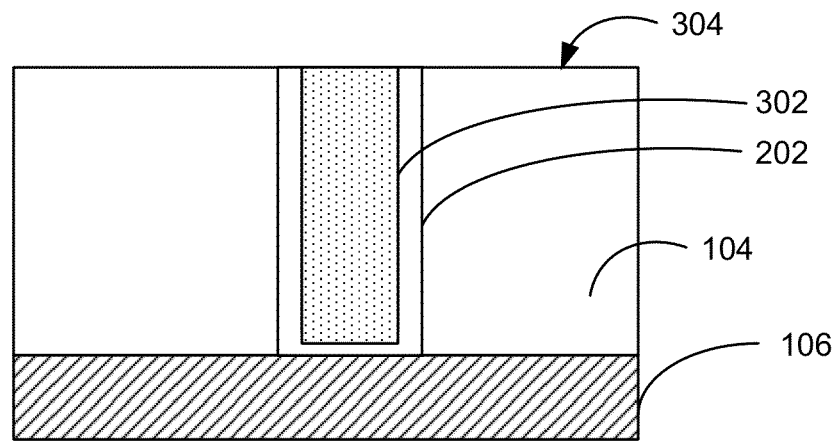

As shown in FIG. 3, the present method includes using one or more electrode materials to fill opening 202 so that an electrode 302 is formed. Electrode 302 can be configured as a plug structure in interlayer insulator material 104. Electrode materials can comprise a metal material such as tungsten, copper, aluminum, titanium, tantalum, zirconium, hathium, and others. Electrode materials can also comprise a combination of materials, for example, a metal material over a semiconductor material. Also, the electrode materials can include metal nitrides, like titanium nitride, tantalum nitride and so on. The combination of materials can also be a first metal material over a second metal material. When the electrode material comprises a semiconductor material, it can be a silicon material doped using a suitable impurity species (p-type or n-type). The silicon material can be polysilicon, amorphous silicon, or crystalline silicon depending on the embodiment. It is desirable for metal oxide memory elements to utilize one or more of the transition metals, where transition metals include Scandium, Titanium, Vanadium, Chromium, Manganese, Iron, Cobalt, Nickel, Copper, Zinc, Yttrium, Zirconium, Niobium, Molybdenum, Technetium, Ruthenium, Rhodium, Palladium, Silver, Cadmium, Hafnium, Tantalum, and Tungsten, among others.

In some embodiments, the electrode material after deposition may overlie the substrate outside of the opening 102, and can be subjected to a planarization process to remove it from an interlayer insulator material surface 304. The planarization process also isolates the electrode material in the plug structure to form electrode 302 for the memory device, as illustrated in FIG. 3.

Figure 4:
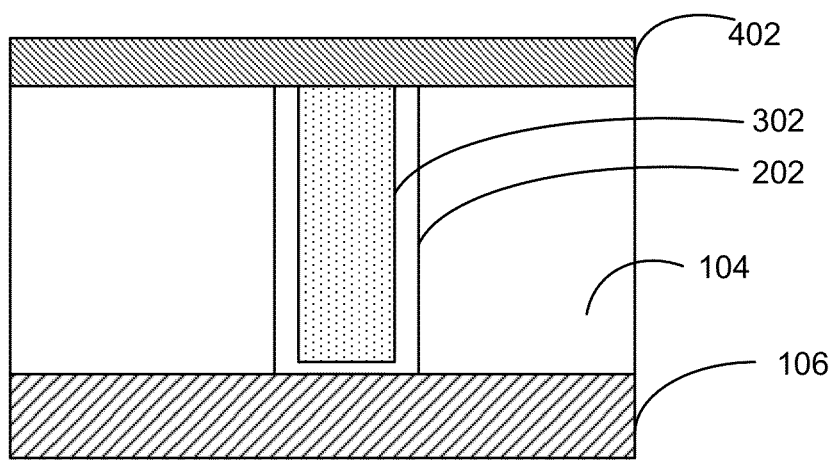

Referring to FIG. 4, a photosensitive material 402, such as a photoresist, is deposited over the surface of electrode 302, layer 202, and interlayer insulator material 304, as shown. Commercially available deep ultraviolet DUV positive or negative photoresists, including photoresists that include photoacid generators, can be used. Photo-acid generators include for example, a triarylsufonium salt, a diaryliodonium salt, an onium salt, a sulfonate, or a sulfone, and others. The photosensitive material 402 in some embodiments can be deposited using a spin coating process. Some photosensitive materials after deposit can be subjected to a treatment (such as a "soft bake" heat treatment) to remove solvents from photosensitive material 402.

Figure 5:
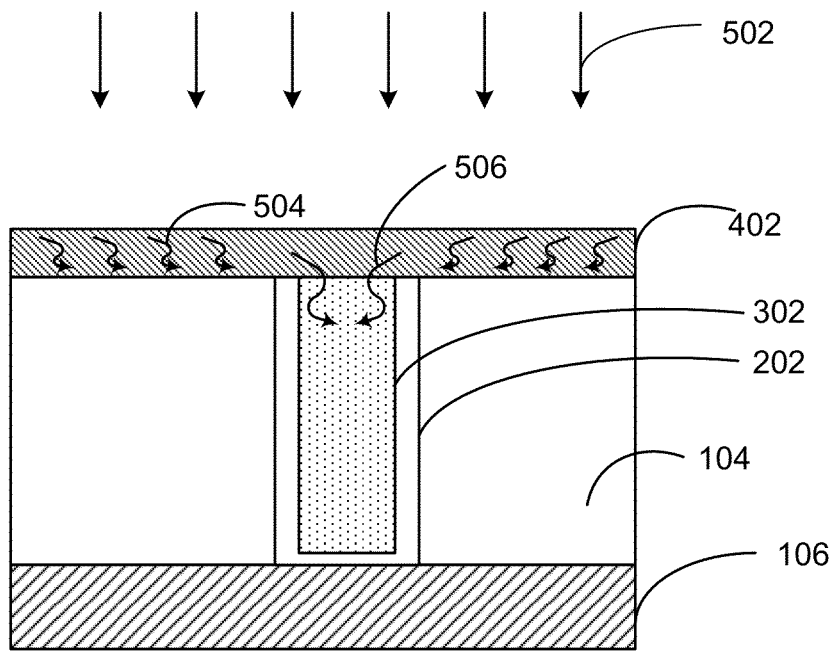

As shown in FIG. 5, radiation 502 is directed to photosensitive material 402. Radiation 502 can be light having a wavelength that induces formation of the oxidizing reactant. In some embodiments, the radiation can be in the ultraviolet or the deep ultraviolet wavelength range. The photoresist material can comprise a photo-acid generator, forming a photo-acid 504 upon exposure to radiation 502. In certain embodiments, the wavelength of ultraviolet light used can range from about 190 nm to about 250 nm. The photo-acid can be an oxidizing reactant in various embodiments.

Photo-acid 504 causes oxidation 506 of metal at the surface of electrode 302 to form a corresponding metal oxide. Photo-acid 504 also causes oxidation of the liner 202 near the electrode surface in various embodiments. After exposure to radiation, a second heat treatment, for example a post exposure bake, may be applied to photosensitive material 402. The post exposure bake can further promote the formation of the photo-acid generator and further propagate the oxidizing reaction. Optionally after that, the photosensitive material can be developed, using for example a solvent to solubilize and to remove the exposed photosensitive material, while optionally leaving a pattern of unexposed photosensitive material that can be used for further process steps. The post exposure bake step can be carried out at a temperature ranging from about 80 to about 120 degree Celsius, and usually no greater than about 140 degree Celsius. The formation of the metal oxide using this process has comparatively low impact on the thermal budget for a manufacturing process. As a result reliability is improved for the device, and costs are reduced.

The photosensitive material is then removed over the metal oxide layer by dry or wet removal steps. The material can be removed using a dry, oxygen plasma ashing process, or using a wet chemical cleaning agent.

Figure 6:
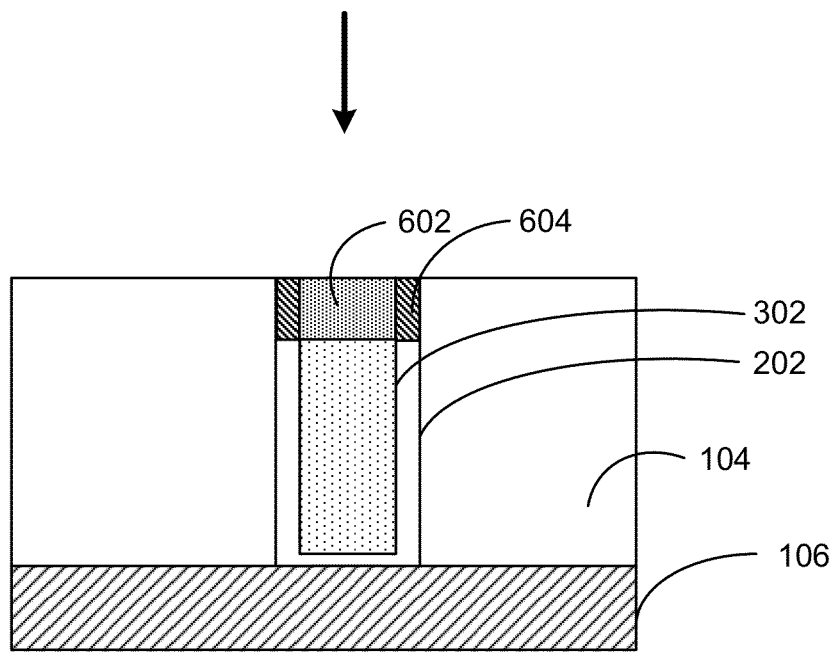

FIG. 6 illustrates the partial memory device after removal of the photosensitive material. As shown, an oxide layer 602 is formed; for example, a metal oxide resulting from oxidation of the surface of electrode 302. As examples, an electrode 302 with a surface of tungsten can have an oxide layer 602 comprised of tungsten oxide which has a composition of $WO_x$, where x ranges from 1 to 3; for titanium as the electrode surface, oxide layer 602 can be titanium oxide ($TiO_x$, where x ranges from 0.5 to 2); for tantalum as the electrode surface, oxide layer 602 can be tantalum oxide ($TaO_x$, x ranges from 0.5 to 2.5); and others. An oxidized diffusion barrier layer 604 is also formed. The thickness and other characteristics of oxide layer 602 can be determined by the length of time of the radiation exposure (for example, ultraviolet light), the temperature used in the second heat treatment (for example, the post exposure bake), and the length of time of the second heat treatment, among other factors. In representative embodiments, where the metal oxide is used as a memory element, the thickness of the metal oxide layer can be between about 5 nanometers and 100 nanometers. For a conductive metal nitride diffusion barrier layer 202 (or liner), oxidized diffusion barrier layer 604 can be comprised of a nitrogen-containing metal oxide. For example, for titanium nitride (TiN) as diffusion barrier layer 202, layer 604 can have a composition $TiO_xN$. Using this process, the oxide of the liner can have a thickness that is substantially the same at that of the electrode surface.

Figure 6A:
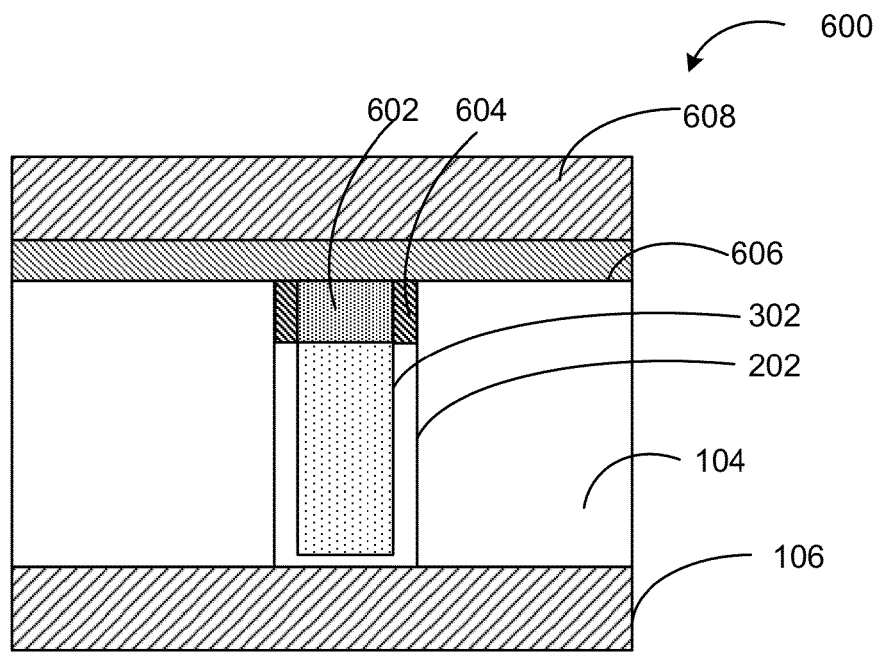
FIG. 6A illustrates implementations of the metal oxide memory material in a programmable metallization cell for a memory device.

Referring to FIG. 6A, in various embodiments, the present method can include forming an ion supply layer 606 over oxide layer 602 to form a memory device (for example, a programmable metallization cell (PMC)) 600, where the metal oxide functions as a memory material for the memory device. A basic process for this aspect includes forming first electrode including a core and a liner, the core including metal at a metal surface; depositing a photosensitive material over the metal surface; exposing the photosensitive material to radiation which induces oxidation of the metal at the metal surface and of the liner near the metal surface to form a dielectric layer including a metal oxide and an oxide of material in the liner; forming an ion source layer over the dielectric layer; and forming an electrode over the ion source layer. Using this process, the thicknesses of the metal oxide and an oxide of material in the liner in the dielectric layer can be substantially the same.

The dielectric layer, including the metal oxide, supports an electrolytic formation of a conductive bridge and electrolytic degradation of the conductive bridge for a low resistance state and a high resistance state for the memory device. Again, taking tungsten oxide as an example memory material, the ion supply layer can include metal ions dissolved in chalcogenide. The chalcogenide can be selenide, sulfide, or telluride and the metal ions can be provided by copper zinc, silver, and others. Additionally, a second electrode 608 can be formed over the ion supply layer to connect the memory device to control circuitry in various embodiments.

Figure 6B:
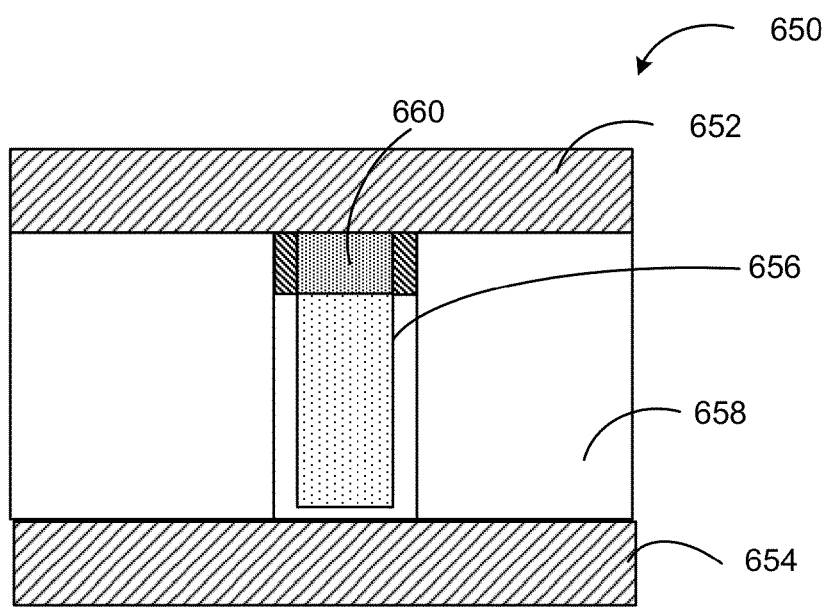
FIG. 6B illustrate implementations of the metal oxide memory material in a resistance programmable cell (for example, an RRAM) memory devices

Depending on the implementation, metal oxide memory material as formed can be applied to resistive memory devices, for example, in a resistive random access memory (RRAM) device. FIG. 6B illustrates a RRAM cell 650. The metal oxide memory material can have resistance modulated by application of a stimulus such as voltage or current. The change of resistance may be due to migration of non-stoichiometric ions from the metal oxide from one electrode to the other electrode. As shown, cell 650 includes a top conductor 652, a bottom conductor 654, and a plug structure 656 connected to bottom electrode 654. Plug structure 656 is disposed in an interlayer insulator 658 in various embodiments. Plug structure 656 can comprised of metals such as tungsten, tantalum, titanium, zinc and memory material 660, comprising corresponding metal oxide, is formed over the metal in the plug structure. In certain embodiments, top electrode 652 can be an inert electrode.

FIGS. 7-10 illustrate an implementation of the present method of forming metal oxide over selected electrodes on a plurality of interconnect structures. Conventionally, metal oxide for memory material can be formed on selected electrodes using thermal oxidation (for example, a rapid thermal oxidation process). In addition to being a high-temperature process, electrodes intended for interconnects (for example, interlayer conductors) need to be protected from thermal oxidation. Silicon oxide or silicon nitride are typically provided as a protective layer during thermal oxidation, and then removed afterward. Another approach is to allow oxide to form on all the electrodes, and then remove the oxide formed on interconnect electrodes using an etching process. Both of these removal methods can cause damage to the interconnect structure. Accordingly, the present method provides a low-temperature process that can be readily integrated into an interconnect process to simplify forming of a metal oxide memory material for a memory device as illustrated in FIGS. 7-10.

Figure 7:
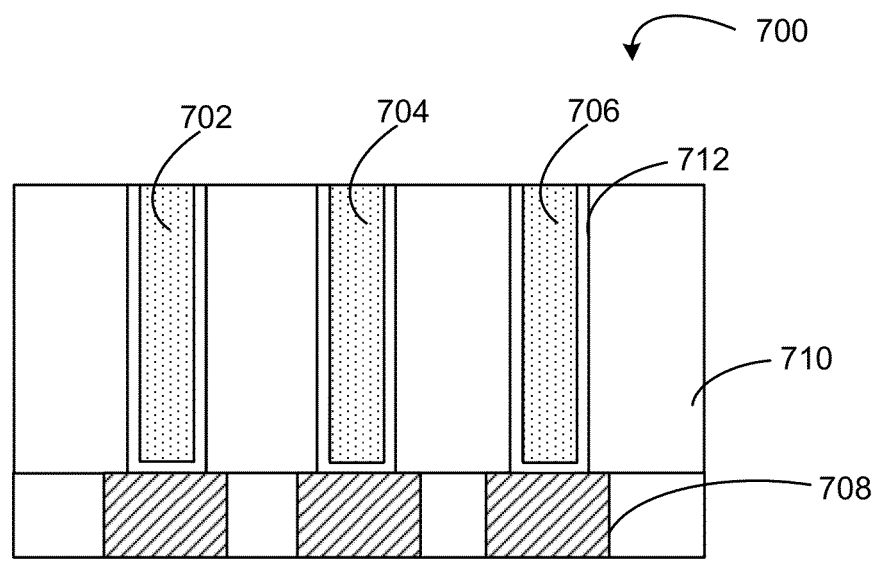
FIGS. 7-10 illustrate structures including, and a method of integrating, the oxide memory material fabrication and interconnect fabrication.

FIG. 7 is a partial memory device 700. Partial memory device 700 can be formed using process steps as illustrated in FIGS. 1-3. As shown, partial memory device 700 includes a plurality of electrodes disposed in a plurality of plug structures. Each of the plug structures is formed in an interlayer insulator 710 and connected to a conductive region 708. A diffusion barrier layer 712 lines each of the plug structures, as shown. In various embodiments, the electrode is comprised of a metal material at least on a surface. Examples of such metal materials may include tungsten, titanium, tantalum, and others. Three electrodes 702, 704, and 706 are illustrated.

Figure 8:
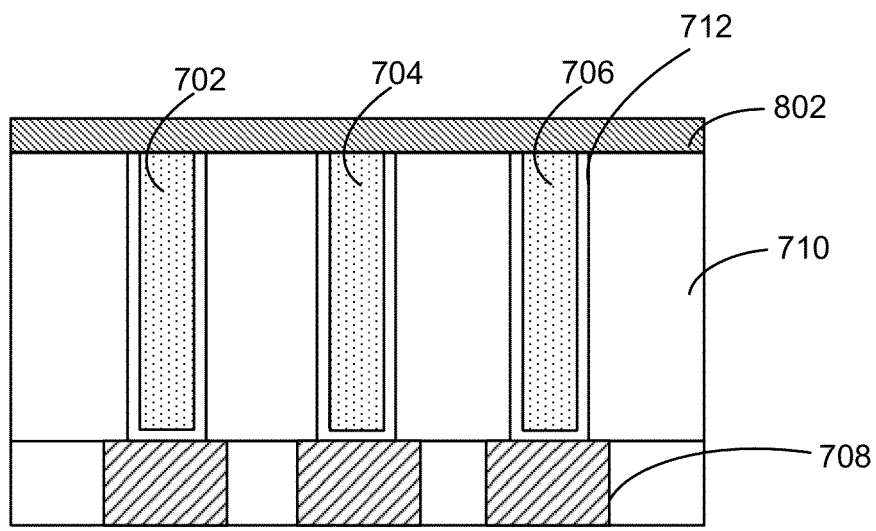

As shown in FIG. 8, a photosensitive material 802 is deposited over electrodes 702, 704, and 706 and over interlayer insulator 710. Photosensitive material 802 can be deposited using a spin coating process in various embodiments. Photosensitive material 802 can be a photoresist material used in lithography for microelectronic device fabrication in certain implementations. A first heat treatment (for example, a soft bake) can be performed on the deposited photosensitive material 802 to remove excessive solvents from the photosensitive material.

Figure 9:
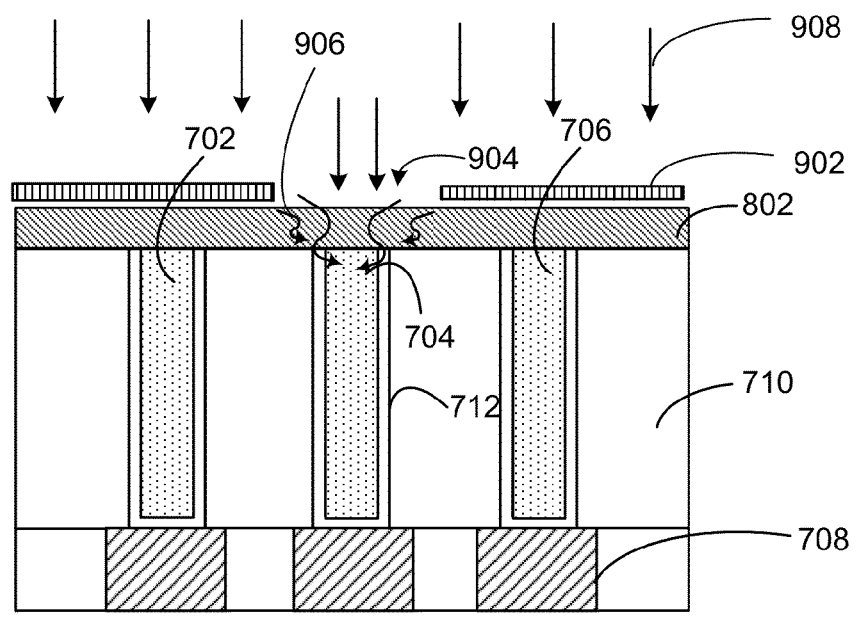

As an example, a memory cell is to be fabricated on electrode 704. As illustrated in FIG. 9, photomask 902 is provided above photosensitive material 802. Photomask 902 includes an aperture 904 to allow radiation 908, for example light having wavelengths in the ultraviolet range or deep ultraviolet range, such as 190-250 nm, for example 248 nm, to be directed toward electrode 704. Electrode 702 and electrode 706 are masked, and therefore would not be exposed. Photosensitive material 802 includes a component, which is a photo-acid generator that forms a photo-acid 906 upon exposure to radiation 908. The photo-acid is an oxidizing reactant in various embodiments. The photo-acid causes formation of an oxide, for example, metal oxide on electrode 704. Photosensitive material 802, after ultraviolet light (for example) exposure, is subjected to a second heat treatment (for example, a post exposure bake) to further promote formation of photo-acid 906. The second heat treatment is usually at a temperature ranging from about 100 degree Celsius to about 110 degree Celsius and no greater than about 120 degree Celsius. After the second heat treatment, photosensitive material 802 can be subjected to an optional developing process to solubilize the exposed photosensitive material 802. Both exposed and unexposed photosensitive material 802 can be removed using a dry removal process and a cleaning process. The dry removal process can be, for example, an ashing process in an oxygen plasma, in various embodiments.

Figure 10:
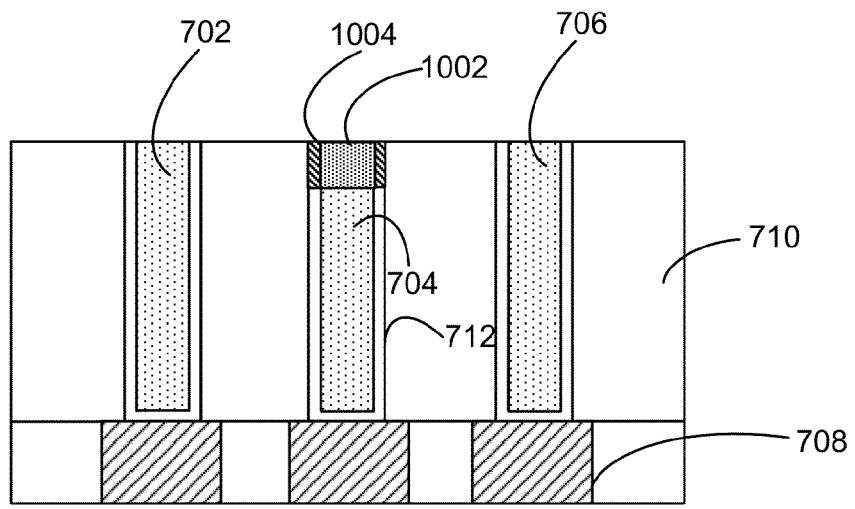

As shown in FIG. 10, an oxide 1002 is formed on electrode 704 as a result of the interaction of the oxidizing reactant with electrode 704. Masked electrodes 702 and 706 remain unreacted and intact. Concurrently, an oxidized diffusion barrier layer 1004 is formed near the surface of electrode 704. Accordingly, the present method provides a low temperature process for forming an oxide memory material (for example, a metal oxide) and allows a memory cell to be formed directly on a selected electrode surface, and self-aligned to the electrode on which it is formed. Using tungsten as an example electrode material 704, oxide 1002 would be a tungsten oxide having a composition $WO_x$, where x ranges from 1 to 3. For titanium nitride as the example diffusion barrier layer 712, oxidized diffusion barrier layer 1004 would be a nitrogen-containing titanium oxide, having a composition $TiNO_x$. Metal oxide 1002 can have characteristics, such as thickness, determined by radiation exposure time, post exposure bake time and temperature, and others, rendering great flexibility in processing.

Figure 11:
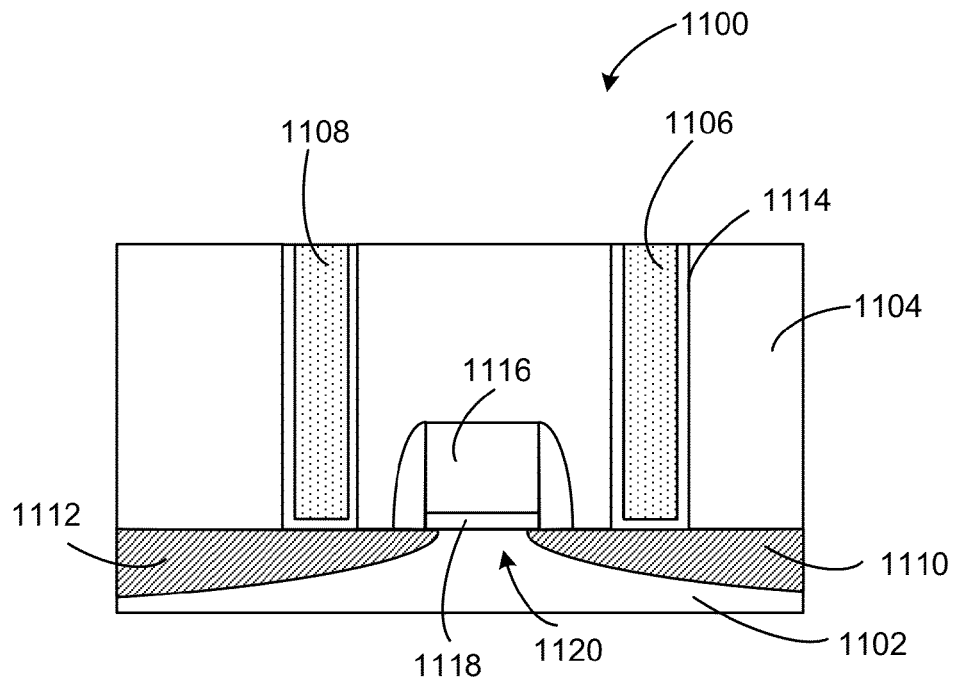
FIGS. 11-13 illustrate structures including, and a method of integrating, the oxide memory material fabrication in CMOS processing.
Figure 12:
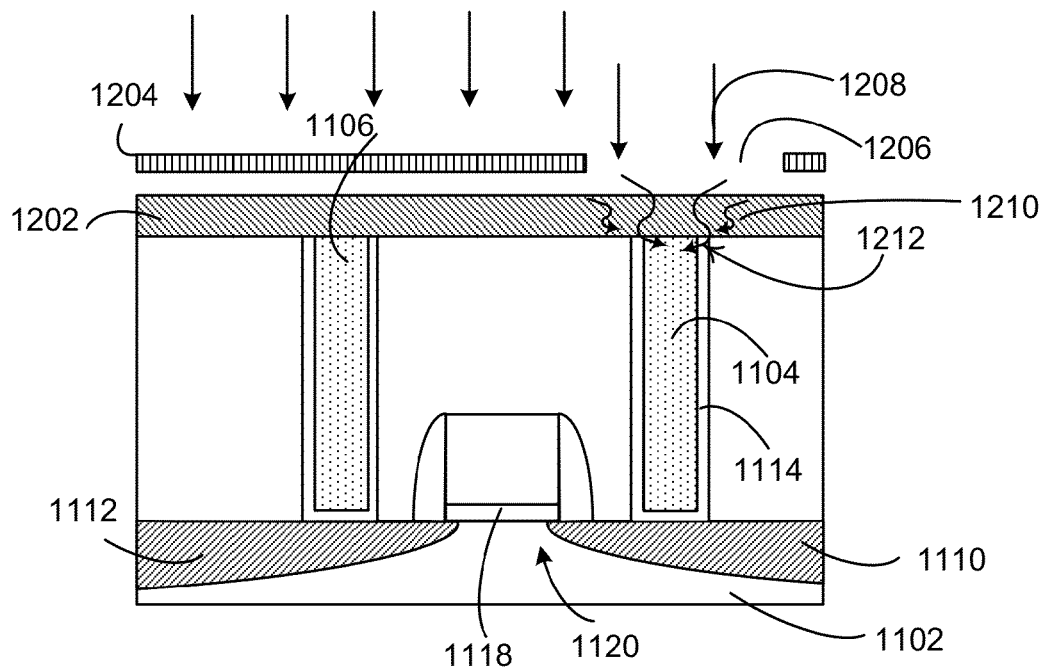
Figure 13:
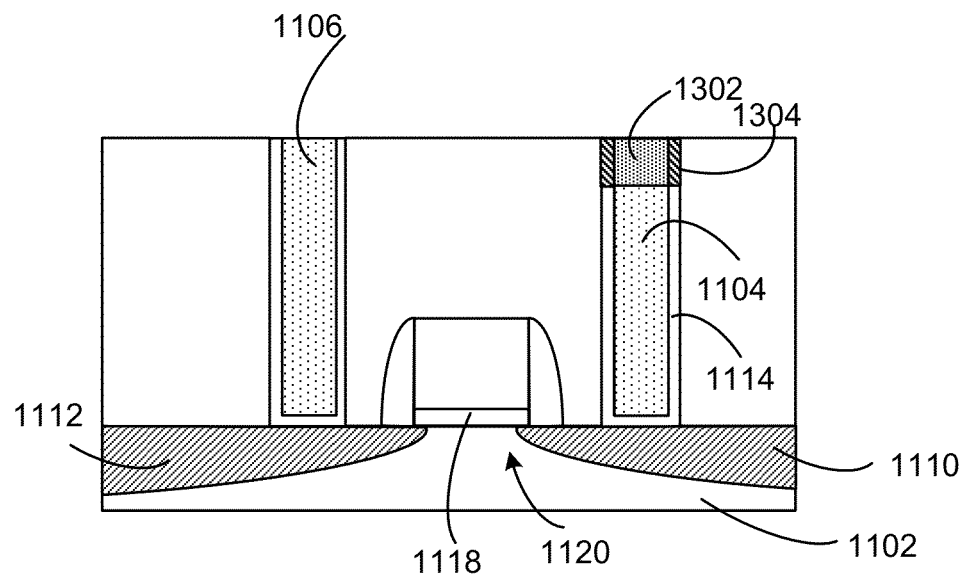

FIGS. 11-13 illustrate an implementation of the present method of integrating the formation of an oxide memory material in CMOS processing. As shown, a partial memory device 1100 is provided. The partial memory device includes a semiconductor substrate 1102. An interlayer insulator 1104 overlies semiconductor substrate 1102. Interlayer insulator 1104 can be silicon oxide, silicon nitride, silicon oxynitride, a high K dielectric material, a low K dielectric material, a combination, and others. A first electrode 1106 and a second conductive feature 1108, such as an interlayer connector or plug, or a conductive line, such as a word line, are disposed in interlayer insulator 1104. As shown, first electrode 1106 is extended to connect to a first conductive region 1110 (for example, a source region) and second conductive feature 1108 is extended to connect to a second conductive region 1112 (for example, a drain region) in semiconductor substrate 1102. First electrode 1106 and second conductive feature 1108 can be comprised of the same or different metal materials. In another example implementation, first electrode 1106 and second conductive feature 1108 can each be formed from a combination of materials (for example, a combination of metal materials or a metal material over a semiconductor material, and others). Depending on the embodiment, the first electrode 1106 can be a plug structure including a diffusion barrier layer 1114 before being filled with the electrode material. Partial memory device 1100 also includes a gate structure 1116 insulated from semiconductor substrate 1102 by a gate oxide 1118, over a channel region 1120 between first conductive region 1110 and second conductive region 1112, as shown.

As an example, a memory device is to be formed on first electrode 1106, connected to first conductive region 1110. Referring to FIG. 12, a photosensitive material 1202 is deposited over interlayer insulator 1104, first electrode 1106, and second conductive feature 1108. Photosensitive material 1202 is first subjected to a first heat treatment (for example, a soft bake) to remove excessive solvents. A photomask 1204 is provided above photosensitive material 1202. Photomask 1204 has an aperture 1206 positioned to allow light to reach photosensitive material 1202 over first electrode 1106 while second conductive feature 1108 is masked and therefore will not be exposed. Photosensitive material 1202 comprises a photo-acid generator component that forms a photo-acid 1210 upon exposure to radiation 1208. A photo-acid can be an oxidizing reactant in various embodiments. Photo-acid 1210 causes oxidation 1212 of first electrode 1106 near a surface, as shown in FIG. 13. After exposure, photosensitive material 1202 can be subjected to a second heat treatment (for example, a post exposure bake) to further promote formation of photo-acid 1210.

As FIG. 13 illustrates, an oxide material 1302 resulting from oxidation of first electrode 1106 is formed on a surface of first electrode 1106. Second conductive feature 1108 remains unreacted and functions as an interconnect conductor. First electrode 1106 comprises a metal material on its surface. Oxide material 1302 can be a metal oxide suitable for a memory material for a programmable metallization cell (PMC) or a resistive random access memory (RRAM) cell in various embodiments. In one example, the metal material can be tungsten and the corresponding metal oxide would be a tungsten oxide layer having a composition of $WO_N$, where x ranges from 1 to 3. Concurrently, an oxidized diffusion barrier layer 1304 forms near a surface of first electrode 1106. For another example, with titanium nitride as diffusion barrier layer 1114, the oxidized diffusion barrier layer 1304 can be a nitrogen-containing titanium oxide having a composition TiNOx. Metal oxide 1302 can have characteristics such as thickness determined by radiation exposure time, post exposure bake time and temperature, and others.

In various embodiments, an ion supply layer can be formed over the oxide material to form a memory cell (for example, a programmable metallization cell (PMC) and others). For tungsten oxide as the memory material, the ion supply layer can include a metal. Examples of such metals are copper, silver, zinc and others. The ion supply layer can also be a corresponding chalcogenide (telluride, sulfide, or selenide) in which the ions are dissolved. A top electrode can be formed over the ion supply layer to connect the memory cell to control circuitry in various embodiments.

In another embodiment, a top electrode can be formed on the metal oxide memory material and a resistive memory device (for example, a resistive random accessed memory, RRAM) can be implemented.

Figure 14:
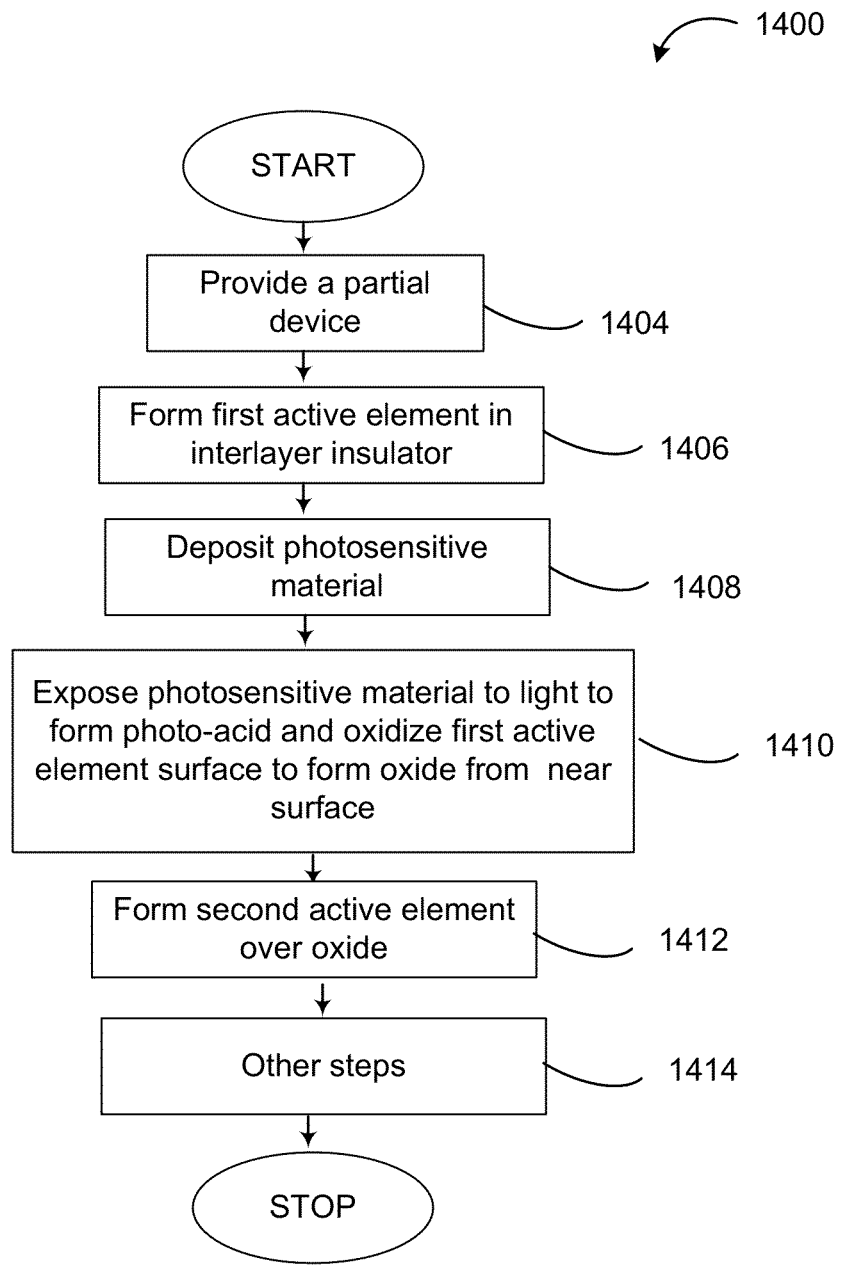
FIG. 14 is a process flow diagram illustrating the method of forming the oxide memory material.

FIG. 14 illustrates a process flow 1400 for a method of manufacturing a component of an integrated circuit. The method includes the following steps, as shown:

Step 1404: Provide a partially formed memory device 100.

Step 1406: Form a first active element on a substrate, the first active element can include electrode 302 in a plug structure in an interlayer insulator 104. Electrode 302 can include a metal having a metal surface.

Step 1408: Deposit a photosensitive material 402 over an electrode surface.

Step 1410: Expose photosensitive material 402 to radiation 502. Photosensitive material 402 includes a photo-acid generator that forms photo-acid 504 which induces oxidation the metal at the metal surface to form a metal oxide layer 602.

Step 1412: Forming a second active element over the metal oxide layer.

Step 1414: Other process steps, such as metallization and passivation, and others.

The sequence of steps listed above describes a method for forming an oxide material (for example, a metal oxide) for a memory material. In various embodiments, the other process steps 1412 can further form an ion supply layer or a second electrode over the oxide memory material for a memory cell (for example, a resistive random access memory or a programmable metallization cell). The oxide memory material is adapted for an electrolytic formation of a conductive bridge and an electrolytic degradation of the conductive bridge in various embodiments.

In various embodiments, a device structure includes a first electrode, a second electrode, an ion supply layer, and a metal oxide material adapted to electrolytic formation of a conductive bridge and electrolytic degradation of the conductive bridge. The first electrode can include a first metal material or at least a first metal material near a surface of the electrode. The metal oxide memory material can be formed by oxidation of the first electrode by a photo-acid, which is an oxidizing reactant, from a photosensitive material upon exposure to radiation (for example, light in wavelength in ultraviolet or deep ultraviolet range). The ion supply layer can be a second metal material or a chalcogenide including ions of a second metal material. Examples of the second metal material are copper, zinc or silver. The chalcogenide can be telluride, selenide, or sulfide, depending on the application. Depending on the embodiment, the second electrode overlies the ion supply layer and connects the memory device to various control circuitries. Examples of applications of the device structure are provided in FIGS. 15 and 16.

Memory material formed using the method shown in FIGS. 1-6 exhibits programmable resistive characteristics and can be used in a programmable resistive cell (RRAM) 650 as shown in FIG. 6B.

Figure 15A:
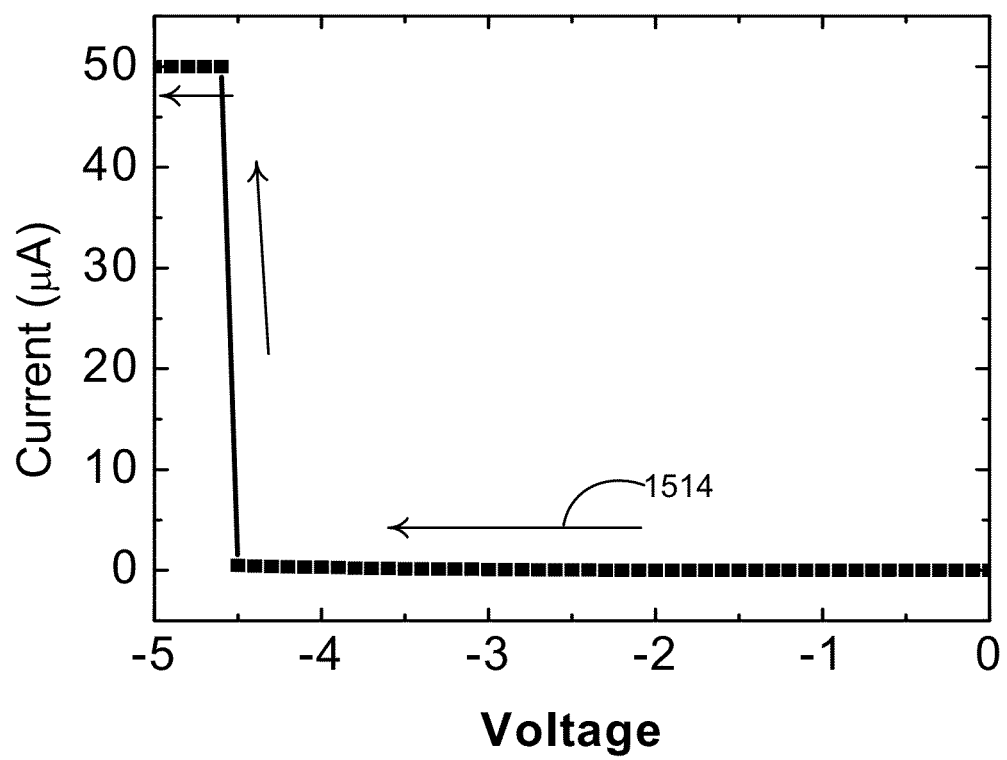
FIGS. 15A and 15B illustrate current as function of voltage (IV) plots of an RRAM memory device as in FIG. 6B using tungsten oxide memory material formed by oxidation of tungsten by the method illustrated in FIGS. 1-6.
Figure 15B:
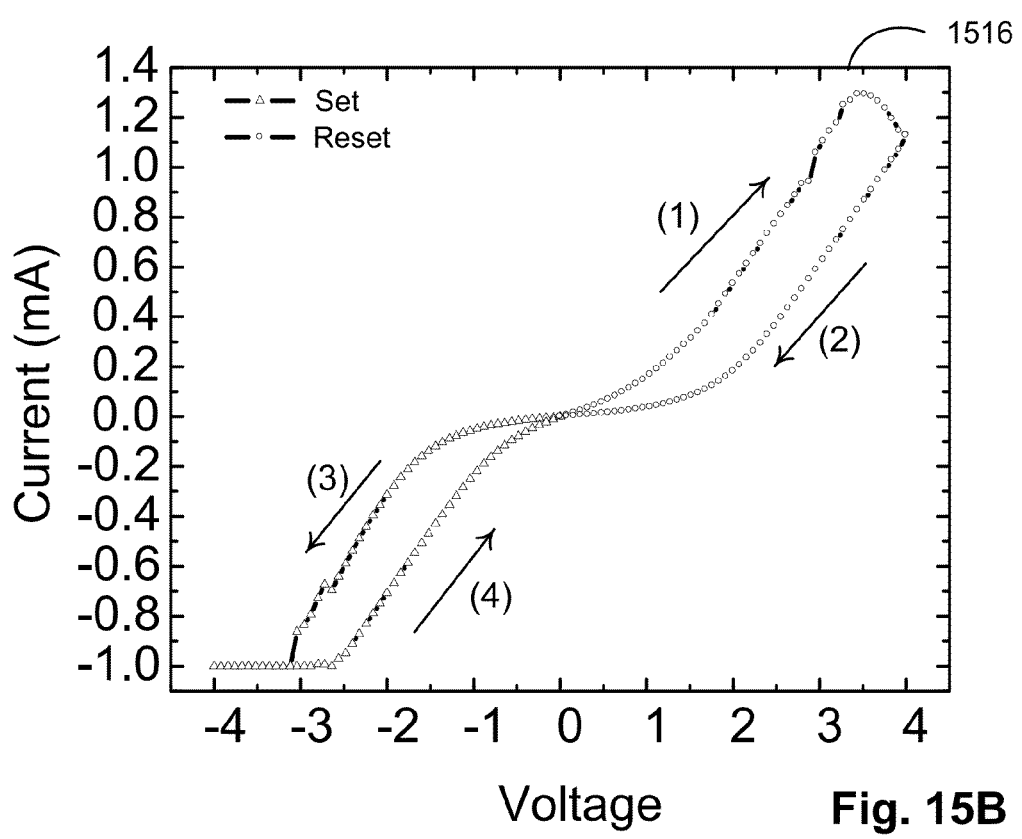

FIGS. 15A and 15B illustrate measured current as a function of applied voltage (IV plot) of RRAM cell 650 in FIG. 6B. Plug structure 656 is comprised of tungsten in this example. A memory material 660 comprised of tungsten oxide is formed on the tungsten by the method shown in FIGS. 1-6. As an example, voltage (positive or negative) is applied to top conductor 652 and bottom electrode 654 is ground. FIG. 15A: Plot 1514 illustrates a forming process applied to a fabricated cell 650. When the voltage applied is changed from 0 to approximately negative 4.5 volts, little or no current flows. Cell 650 is in a high resistant state. When the voltage applied is greater than about −4.5 volts, RRAM cell 650 shifts to a low resistance state, with an abrupt increase in current (50 uA) observed. RRAM cell 650 can be programmed to various states or bit values in set and reset processes.

Referring to FIG. 15B, Plot 1516 illustrates an IV plot for the set process and reset process for RRAM cell 650. After forming, cell 650 is in a low resistance state. To reset (erase) cell 650, a voltage of about +4 volts can be applied to top electrode 652 to revert cell 650 to a high resistance state, as shown by a decrease in current flow in the cell. To set (program) cell 650, a negative voltage can be applied to top conductor 652, shifting cell 650 to a low resistance state. Depending on the magnitude of the set voltage applied, the cell can be placed in various resistive states. Each of the resistive states can be determined by applying a suitable read voltage and then measuring the corresponding read current.

Figure 16:
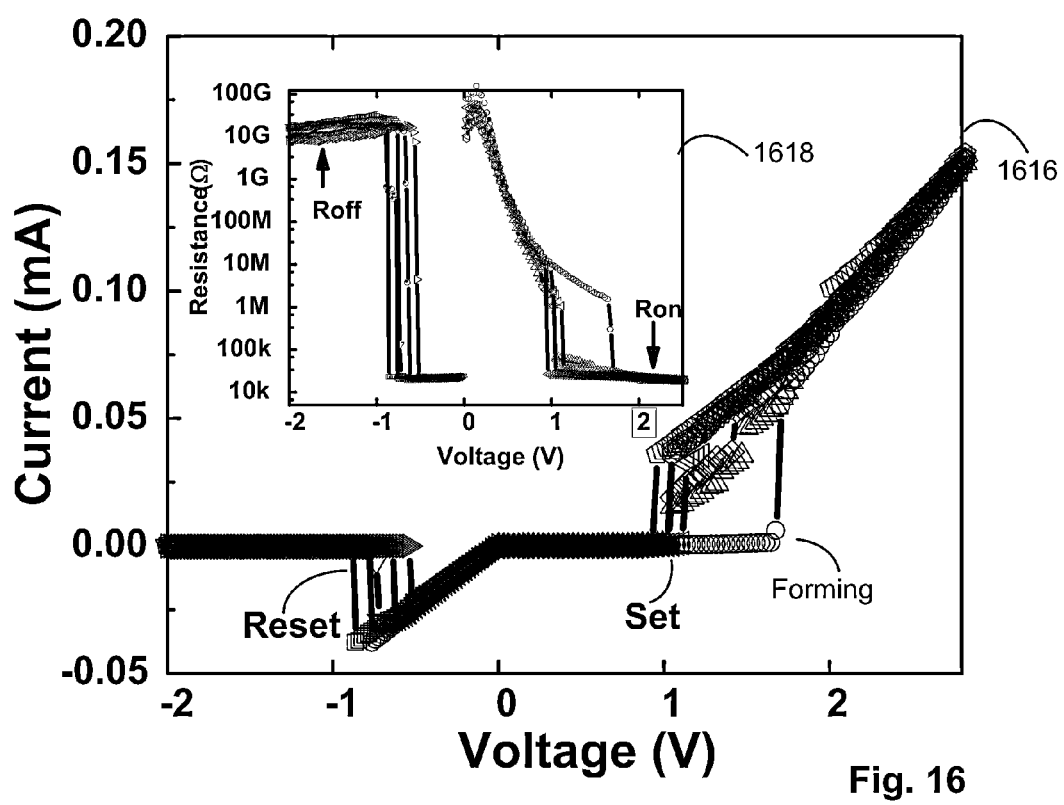
FIG. 16 illustrates current as a function of voltage (IV) plots of a programmable metallization cell (PMC) as in FIG. 6A using tungsten oxide material formed by oxidation of tungsten by the method illustrated in FIGS. 1-6.

Memory material formed using the method shown in FIGS. 1-6 exhibits programmable metallization characteristics and can be used in a programmable metallization cell (PMC) 600 as shown in FIG. 6A. FIG. 16 shows IV plot 1616 for PMC cell 600, for forming, set and reset operations. In this example, the as-fabricated cell is in a high resistance state, no current flow is detected in the cell. Voltage (positive or negative) is applied to second electrode 608, and conductive region 106 (connected to electrode 302) is ground. When a voltage greater than a forming voltage of about +1.7 volts is applied to cell 600, an abrupt increase in current occurs. After forming, a set voltage of about +1 volt is applied to program cell 600, and cell 600 shifts to a low resistance state. To perform a reset operation after program, a reset voltage of about −1 volt is applied, and cell 600 shifts to a high resistance state. As shown in resistance verses voltage (RV) plot 1618, cell 600 exhibits a desirable ON/OFF resistance ratio greater than $10^6$. To determine a resistance state (high resistance or low resistance) of cell 600, a read voltage is applied and a read current is measured. The read voltage can have a magnitude no greater than the set voltage or the reset voltage.

Figure 17:
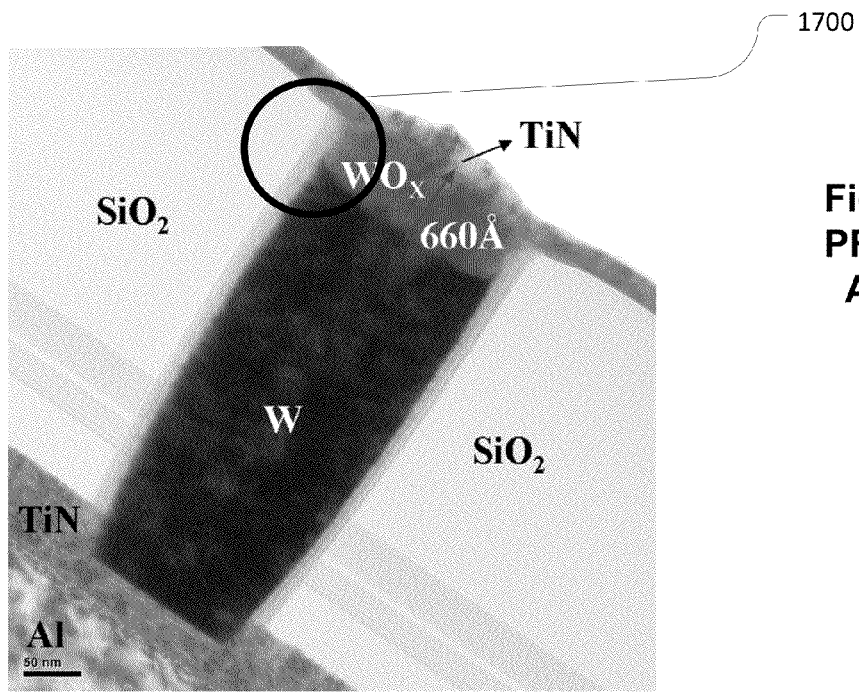
FIGS. 17 and 18 are images contrasting a metal oxide structure made using thermal oxidation with a metal oxide structure made as described herein.
Figure 18:
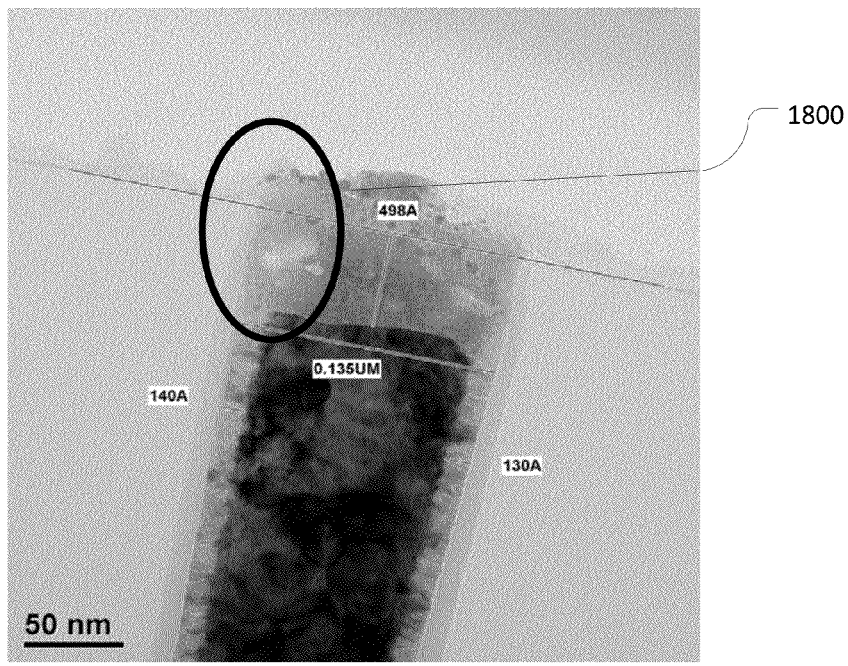

FIGS. 17 and 18 are images of an electrode with a metal oxide layer made using a prior art thermal process, with a top electrode, and of an electrode with a metal oxide layer made as described herein, with a top electrode, respectively.

FIG. 17 shows a structure including a tungsten plug with a titanium nitride liner about that extend through an interlayer insulator that comprises silicon oxide. The plug contacts underlying circuitry, in this case as aluminum line. In FIG. 17, the metal oxide formed using thermal oxidation on the surface of the core is about 66 nanometers thick, while the oxide 1700 of the liner is very thin, perhaps 1 nanometer thick, and not apparent in the image.

In contrast, FIG. 18 shows a similar structure including a tungsten plug with a titanium nitride liner (about 13 nanometers thick) that extend through an interlayer insulator that comprises silicon oxide. In FIG. 18, the metal oxide is formed using the technology described herein including use of a photosensitive material exposed to radiation to induce oxidation. As shown, the oxidation on the surface of the core is about 50 nanometers thick, while the oxide 1800 of the liner is substantially the same thickness.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a component of an integrated circuit, comprising:
    forming a first active element on a substrate, the first active element including metal having a metal surface, wherein the first active element comprises a first electrode with a plug structure including a core and a liner in an interlayer insulator, wherein the core comprises the metal, and the liner comprises a diffusion barrier;
    depositing a photosensitive material over the metal surface;
    exposing the photosensitive material to radiation which induces oxidation of the metal at the metal surface to form a metal oxide layer; and
    forming a second active element over the metal oxide layer, wherein the second active element comprises a second electrode, whereby the component comprises a programmable resistance memory cell.

2. The method of claim 1, wherein the photosensitive material produces an oxidizing reactant in response to the radiation.

3. The method of claim 1, wherein the photosensitive material comprises a photo-acid generator, and the radiation has a wavelength which induces the formation of photo-acid by the photo-acid generator.

4. The method of claim 1, wherein the metal is a transition metal.

5. The method of claim 1, wherein an oxide of material in the liner is formed near the metal surface.

6. The method of claim 5, wherein the oxide of material in the liner has a thickness substantially the same as a thickness of the metal oxide on the core.

7. An integrated circuit memory manufactured according to claim 6.

8. The method of claim 1, wherein the second active element comprises an ion source layer over the metal oxide, and including forming an electrode over the ion source layer.

9. The method of claim 1, further comprising removing the photosensitive material after forming the metal oxide.

10. A method of manufacturing components of an integrated circuit, comprising:
    forming a plurality of first active elements on a substrate, first active elements in the plurality of first active elements comprise first electrodes including plug structures having cores and liners in an interlayer insulator, wherein the cores comprise a metal having metal surfaces and the liners comprise a diffusion barrier;
    depositing a photosensitive material over the metal surfaces of the plurality of first active elements;
    directing radiation through a photomask to photosensitive material over the metal surfaces of selected first active elements, while blocking radiation from the photosensitive material over unselected first active elements, which induces oxidation of the metal at the metal surfaces to form a metal oxide layer on the selected first active elements; and
    forming second active elements over the metal oxide layers on the selected first active elements, whereby the components comprise programmable resistance memory cells.

11. The method of claim 10, wherein the unselected first active elements include interlayer conductors.

12. The method of claim 10, wherein the photosensitive material produces an oxidizing reactant in response to the radiation.

13. The method of claim 10, wherein the metal is a transition metal.

14. The method of claim 10, wherein the photosensitive material comprises a photo-acid generator, and the radiation has a wavelength which induces the formation of photo-acid by the photo-acid generator.

15. The method of claim 10, wherein an oxide of material in the liner is formed near the metal surface.

16. The method of claim 15, wherein the oxide of material in the liner has a thickness substantially the same as a thickness of the metal oxide on the core.

17. An integrated circuit memory manufactured according to claim 10.

18. The method of claim 1, wherein the second active element comprises an ion source layer over the metal oxide, and including forming an electrode over the ion source layer.

19. The method of claim 1, further comprising removing the photosensitive material after forming the metal oxide.

* * * * *